(12) United States Patent
Murden, II

(10) Patent No.: US 7,236,111 B2
(45) Date of Patent: Jun. 26, 2007

(54) LINEARIZING METHODS AND STRUCTURES FOR AMPLIFIERS

(75) Inventor: Franklin Marshall Murden, II, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 117 days.

(21) Appl. No.: 11/262,049

(22) Filed: Oct. 28, 2005

(65) Prior Publication Data

US 2007/0109166 A1    May 17, 2007

(51) Int. Cl.
   *H03M 1/06* (2006.01)
(52) U.S. Cl. .................. 341/119; 341/127; 341/155
(58) Field of Classification Search ............ 341/118, 341/119, 127, 155; 330/264, 267, 285, 288
   See application file for complete search history.

(56) References Cited

U.S. PATENT DOCUMENTS

| | | | |
|---|---|---|---|
| 4,570,128 A | | 2/1986 | Monticelli .................. 330/267 |
| 4,599,602 A | * | 7/1986 | Matzuzawa et al. ......... 341/161 |
| 5,313,207 A | * | 5/1994 | Kouno et al. ............... 341/156 |
| 5,530,444 A | * | 6/1996 | Tice et al. .................. 341/156 |
| 5,828,329 A | * | 10/1998 | Burns ......................... 341/155 |
| 6,078,220 A | | 6/2000 | Bales ......................... 330/264 |
| 6,104,244 A | | 8/2000 | Gilbert ....................... 330/267 |
| 6,172,636 B1 | * | 1/2001 | Murden et al. .............. 341/155 |
| 6,246,353 B1 | * | 6/2001 | Elliott et al. ................ 341/156 |
| 6,265,929 B1 | | 7/2001 | Hauser ....................... 327/404 |
| 6,313,667 B1 | * | 11/2001 | Eschauzier .................. 327/65 |
| 6,720,817 B2 | | 4/2004 | El-Gamal .................... 327/350 |
| 6,774,723 B2 | | 8/2004 | Sabouri ...................... 330/288 |
| 6,853,238 B1 | | 2/2005 | Dempsey et al. ........... 327/539 |
| 6,879,213 B2 | | 4/2005 | Darzy ........................ 330/267 |
| 7,002,499 B2 | * | 2/2006 | Kaplan ....................... 341/144 |
| 7,071,858 B2 | * | 7/2006 | Pan ............................ 341/133 |

OTHER PUBLICATIONS

Smith, Doug, "Evolution of High-Speed Operational Amplifier Structures", IEEE Journal of Solid-State Circuits, vol. 29, No. 10, Oct. 1994, pp. 1166-1179.
Bales, Jim, "A—Op-Amp with a Novel Class AB High Current Output Stage", IEEE Journal of Solid-State Circuits, vol. 32, No. 9, Sep. 1997, pp. 1470-1474.
Guinta, Steve, "Considerations in Designing Single Supply, Low-Power Systems", Analog Dialogue, Analog Devices, Inc., vol. 29, No. 3, Sep. 1995.

* cited by examiner

Primary Examiner—Linh V. Nguyen
(74) Attorney, Agent, or Firm—Koppel, Patrick, Heybl & Dawson

(57) ABSTRACT

Methods and structures are provided to enhance the linearity of amplifiers such as those which include a complementary common-collector amplifier stage. The methods and structures configure this stage so that each transistor of the stage drives an output port through a linearizing resistance. The methods and structures then control a bias current through the stage to substantially be the thermal voltage $V_T$ divided by twice the linearizing resistance.

20 Claims, 4 Drawing Sheets

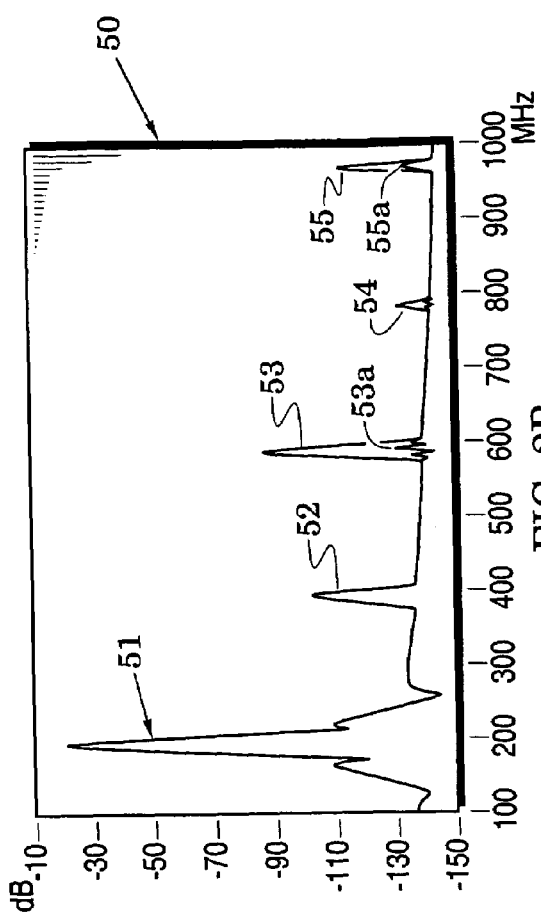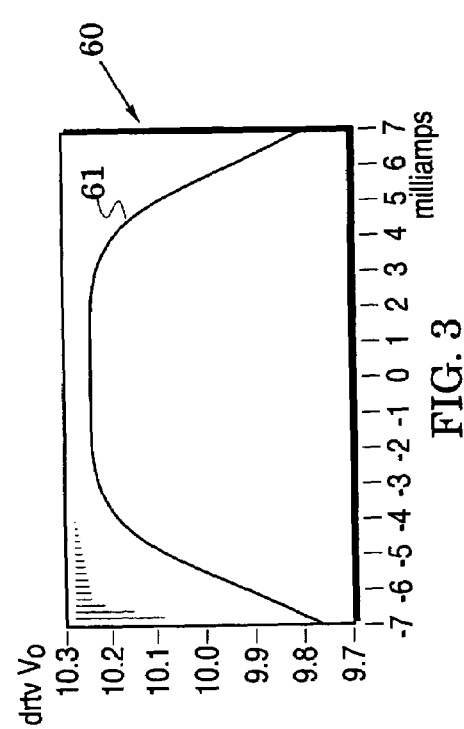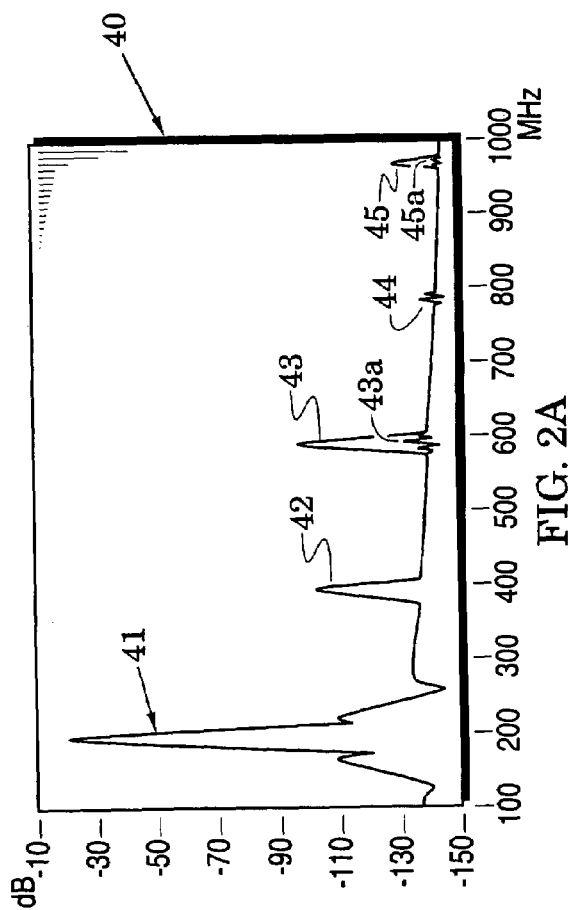

LINEARIZING METHODS AND STRUCTURES FOR AMPLIFIERS

BACKGROUND OF THE INVENTION

1. Field of the Invention

The present invention relates generally to complementary amplifier stages.

2. Description of the Related Art

The usefulness of a variety of signal conditioning systems is dependent upon accurate signal processing. For example, pipelined analog-to-digital converter systems are typically formed with converter stages that are serially connected to thereby convert successive samples of an analog input signal to corresponding digital codes at a high clock rate. In these systems, a sample-and-hold amplifier is typically the initial element that receives the analog input signal and provides the samples for subsequent conversion in the converter stages.

The accuracy of the conversion process is degraded if the sample-and-hold amplifier introduces errors into the samples. These amplifiers may be configured to operate in accordance with various amplifier classes. For example, class A amplifiers amplify over the whole of an input signal cycle. Their transistors are biased such that they are always conducting to some extent and are operated over the most linear portion of their transfer function. Even when there is no input signal, these transistors are always conducting so that power is wasted and efficiency suffers.

Class AB amplifiers often include a complementary stage in which each transistor processes a respective half of the input signal. This arrangement enhances amplifier efficiency but introduces errors because there is generally distortion introduced at the crossover junction between the signal halves.

Accordingly class AB amplifiers may be modified to a class AB structure in which each transistor is operated in a region that is only linear over a respective half of the waveform and which causes the transistor to conduct a small amount over the other half. In class AB amplifiers, the distortion at the crossover junction is substantially reduced.

Regardless of the operational class of amplifiers in a sample-and-hold amplifier, it is important to reduce errors in the sample generation process to thereby enhance the accuracy of the conversion process.

BRIEF SUMMARY OF THE INVENTION

The present invention is directed to methods and structures that enhance the linearity of amplifiers. The novel features of the invention are set forth with particularity in the appended claims. The invention will be best understood from the following description when read in conjunction with the accompanying drawings.

BRIEF DESCRIPTION OF THE DRAWINGS

FIGS. 2A and 2B are graphs that show fast Fourier transforms of an output signal from the amplifier embodiment of FIG. 1;

FIG. 3 is a graph that shows a plot of the small-signal output impedance of the amplifier embodiment of FIG. 1;

DETAILED DESCRIPTION OF THE INVENTION

Method and structure embodiments are provided below for enhancing the linearity of amplifiers. The linearized amplifiers can be used in a variety of systems such as the sample-and-hold amplifiers of the signal converter system of FIG. 5.

Figure 1:
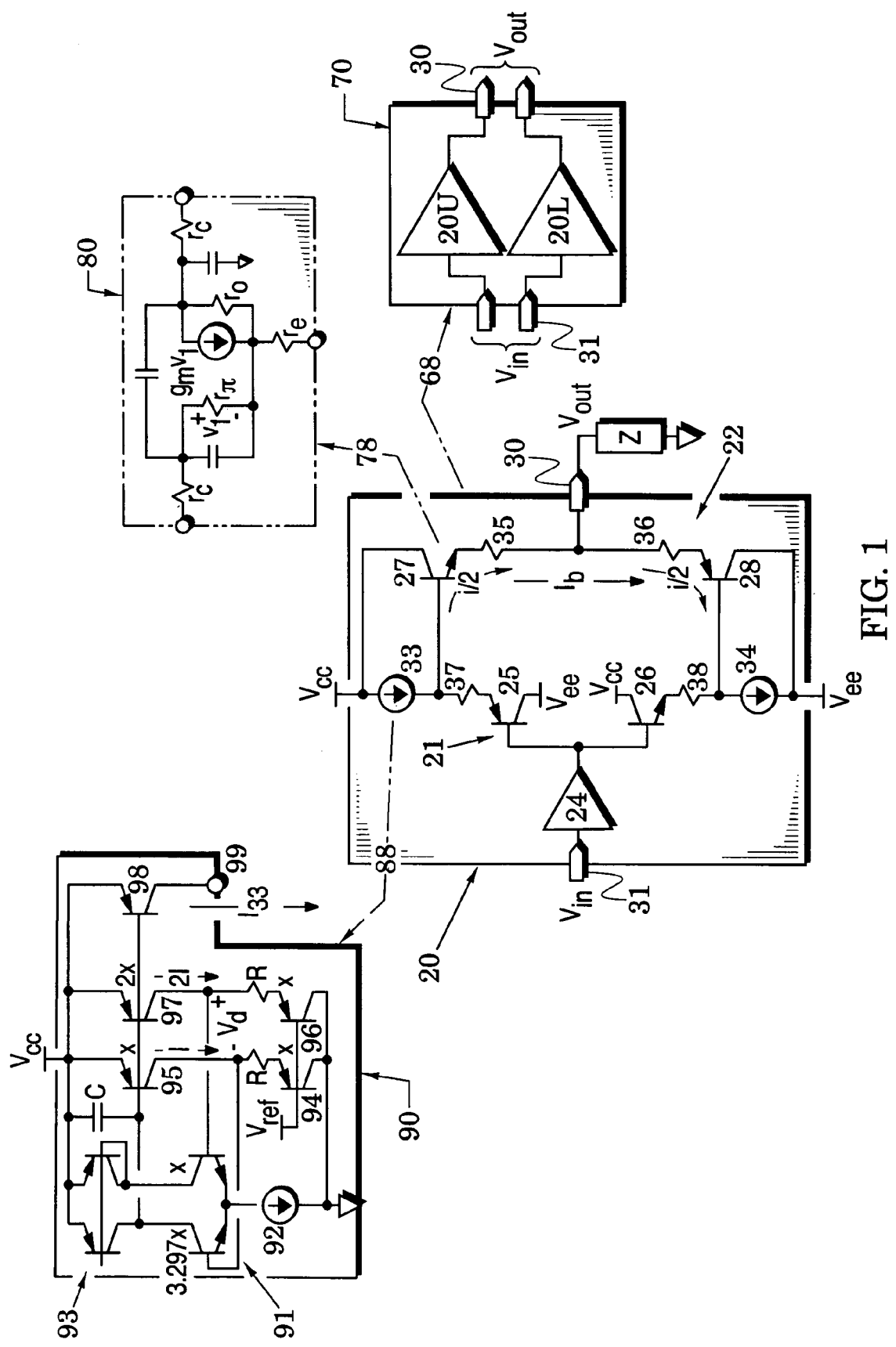
FIG. 1 is a schematic of an amplifier embodiment of the invention.

In particular, FIG. 1 illustrates an amplifier 20 that includes a complementary common-collector amplifier stage 22, a buffer amplifier 24 and an input stage 21 that is coupled between the buffer amplifier and the amplifier stage 22. The input stage 21 is formed by first and second emitter followers 25 and 26 and the amplifier stage 22 includes first and second transistors 27 and 28 that are arranged to drive an output port 30 with their emitters (i.e., they are each arranged in a common-collector arrangement). The buffer amplifier 24 preferably has a unity gain (i.e., gain of approximately one) and is positioned to receive an input voltage $V_{in}$ from an input port 31.

First and second current sources 33 and 34 are respectively arranged to drive currents through the first and second emitter followers 25 and 26 and provide currents to the first and second transistors 27 and 28. Supply voltages (e.g., $V_{cc}$ and $V_{ee}$) are provided to energize the first and second current sources 33 and 34 and the first and second transistors 27 and 28 so that a constant bias current $I_b$ is established through the first and second transistors in response to the current sources 33 and 34. This bias current $I_b$ flows across the output port 30.

In operation, the amplifier 20 responds to the voltage $V_{in}$ at the input port 31 by driving signal currents through a load impedance Z that has been coupled to the output port 30. As shown in FIG. 1, half of this signal current (i/2) flows through each side of the complementary common-collector amplifier stage 22 and the signal currents generate an output voltage $V_{out}$ across the load impedance Z.

In accordance with an important feature of the invention, the linearity of this operation has been enhanced with inserted resistors 35 and 36 that have been respectively inserted between the first and second transistors 27 and 28 and the output port 30. Drive resistors 37 and 38 are also inserted between the emitter followers 25 and 26 and their associated one of the first and second transistors 27 and 28. In an amplifier embodiment, the resistance of the drive resistors substantially equals that of the inserted resistors. In accordance with another important feature of the invention, the inserted resistance of the inserted resistors 35 and 36 is carefully chosen to approximate a linearizing resistance $R_1$ that effectively reduces odd-order harmonics in the output voltage $V_{out}$.

To determine the linearizing resistance $R_1$, it is first noted that, in accordance with the well-known transconductance of bipolar junction transistors, the currents through the first transistor 27 are $$I_b + i/2 = I_S \exp\frac{V_{be}}{V_T} \tag{1}$$

wherein $I_s$ is a transfer characteristic constant and $V_T$ is the thermal voltage. Solving this equation for the base-emitter voltage $V_{be}$ and then expressing voltages around the upper part of the amplifier 20 yields the large-signal transfer function $$V_{out} = V_{in} + V_{be} - V_T \ln\left(\frac{I_b + \frac{i}{2}}{I_S}\right) - \left(I_b + \frac{i}{2}\right)R_1. \quad (2)$$

Noting that the natural logarithm is a nonlinear relationship, it then follows that this portion of equation (2) will introduce nonlinear elements into the output voltage $V_{out}$. To determine these nonlinear elements, a binomial expansion of them is initially formed in terms of the input voltage $V_{in}$. An inverse binomial expansion is then performed to express the nonlinear elements in terms of the output voltage $V_{out}$.

When it is finally assumed that the input voltage is a sinusoid, the following expression for the output voltage $V_{out}$ is derived:

$$V_{out} \approx \left\{\frac{2I_b Z}{[V_T + I_b(R_1 + 2Z)]}\right\} V_i \sin\omega t + \quad (3)$$

$$\left\{\frac{V_T I_b^2 Z\left[\frac{V_T}{2I_b} - R_1\right]}{6[V_T + I_b(R_1 + 2Z)]^5}\right\} V_i^3 \sin 3\omega t + \ldots .$$

Examination of equation (3) shows that the third harmonic of the output voltage $V_{out}$ will be substantially zero if the relationship $$\frac{V_T}{2I_b} = R_1 \quad (4)$$

is satisfied. Assuming a value of 26 millivolts for the thermal voltage $V_T$ and assuming that the bias current $I_b$ is set to 2 milliamps, equation (2) requires that the linearizing resistance $R_1$ be on the order of 6.5 ohms. Although higher-order odd harmonic terms are not shown in equation (3), it has been found that they will also be reduced by insertion of the linearizing resistance $R_1$. It is the reduction of the third harmonic, however, that provides the most dramatic enhancement of linearity.

The graph 40 of FIG. 2A illustrates the advantages of inserting a linearizing resistance into the complementary common-collector amplifier stage 22 wherein that linearizing resistance is determined in accordance with equation (4). The graph 40 is a fast Fourier transform (FFT) of the output voltage $V_{out}$ when the amplitude and frequency of the input voltage $V_{in}$ are respectively 2V peak-to-peak and 195 MHz, the bias current $I_b$ is 2 milliamps, and the signal currents i are approximately 2 milliamps.

When the amplifier 20 does not include the inserted resistors 35 and 36, it is observed that the second harmonic 42 of the FFT is reduced approximately 85 dB from the fundamental 41, that the third harmonic 43 is reduced approximately 80 dB, that the fourth harmonic 44 is negligible, and that the fifth harmonic 45 is reduced approximately 110 dB. When each of the inserted resistors 35 and 36 is inserted to provide a linearizing resistance in accordance with equation (4), the third and fifth harmonics drop virtually into the noise floor as shown by the traces 43a and 45a.

The linearity of the amplifier 20 of FIG. 1 is improved even when it is overdriven. For example, the graph 50 of FIG. 2B is similar to the graph 40 of FIG. 2A but the load currents have been increased to 3 milliamps. When the amplifier 20 does not include the inserted resistors 35 and 36, it is observed that the second harmonic 52 of the FFT is now reduced approximately 85 dB from the fundamental 51, that the third harmonic 53 is reduced approximately 70 dB, that the fourth harmonic 54 is reduced approximately 115 dB, and that the fifth harmonic 55 is reduced approximately 95 dB. When each of the inserted resistors 35 and 36 is inserted to provide a linearizing resistance in accordance with equations (4), the third and fifth harmonics both drop to at least 115 dB below the fundamental as shown by the traces 53a and 55a The graph 60 of FIG. 3 shows a plot 61 of the small-signal driving point impedance at the output port 30 of FIG. 1. This is the impedance looking into the port 30 of the amplifier 20. FIG. 3 indicates that this impedance is essentially flat as the signal current varies over a range of at least ±2 milliamps.

Although even harmonics (e.g., the second harmonic 42 of FIG. 2A) in the output voltage $V_{out}$ are not significantly altered by insertion of the inserted resistors (35 and 36 in FIG. 1), these harmonics can be reduced by other means and structures. For example, the extension arrow 68 in FIG. 1 indicates that the amplifier structures can be extended to a differential amplifier 70 in which the input port 31 and output port 30 are now differential ports and the amplifier 20 is duplicated as upper and lower amplifiers 20U and 20L that are coupled between these ports. This differential structure has been found effective in substantially reducing the even harmonics such as 42 and 52 in FIGS. 2A and 2B.

To this point, the description has assumed that the inserted resistors 35 and 36 of FIG. 1 provide the only resistance in the output paths through the first and second transistors 27 and 28 of the complementary common-collector amplifier stage 22. The equivalent arrow 78, however, indicates an equivalent small-signal transistor circuit 80 for these transistors which includes small-signal resistances $r_\pi$ and $r_o$, transconductance current source $g_m v_o$ (wherein $v_o$ is developed across the small-signal resistance $r_\pi$), and various parasitic capacitances.

In addition, the equivalent circuit 80 includes parasitic resistances $r_b$, $r_c$, and $r_e$ which represent the finite resistance of bulk semiconductor (e.g., silicon) that exists between transistor contacts and active transistor regions. An examination of equation (2) makes it apparent that the bulk emitter resistance $r_e$ effectively contributes a portion of the linearizing resistance $R_1$. It is, therefore, the sum of the bulk emitter resistance $r_e$ and the inserted resistor 35 that make up the linearizing resistance $R_1$ of equation (4).

To enhance accuracy, therefore, the inserted resistance is preferably reduced from the linearizing resistance $R_1$ by the value of the bulk emitter resistance $r_e$. For the case in which the bias current $I_b$ of equation (4) was set to 2 milliamps, $r_e$ of an exemplary transistor 27 may be on the order of 2.5 ohms so that the inserted resistor 35 is preferably reduced from 6.5 ohms to 4.5 ohms.

The linearity of the amplifier 20 of FIG. 1 has been significantly enhanced with inserted resistors 35 and 36 that have been respectively inserted into the complementary common-collector amplifier stage 22. As previously stated, the inserted resistance of the inserted resistors 35 and 36 is carefully chosen to approximate a linearizing resistance $R_1$ that effectively reduces odd-order harmonics in the output voltage $V_{out}$ because it satisfies equation (4).

In equation (4), however, the thermal voltage $V_T$ varies with absolute temperature so that, with a constant bias current $I_b$, the full benefit of the linearizing resistance $R_1$ is only realized in a restricted temperature range. In an embodiment of the amplifier 20, therefore, the current source 33 is preferably realized with a current source 90 that will maintain the bias current $I_b$ in accordance with $$I_b = \frac{V_T}{2R_1} \tag{5}$$

which is a rearranged version of equation (4).

In FIG. 1, a realization arrow 88 indicates a current source 90 that realizes the current of equation (5). The current source 90 includes a differential pair 91 of first and second transistors that is coupled between a current source 92 and a load in the form of a 1:1 current mirror 93.

The bases of transistors 95 and 97 and an output transistor 98 are coupled to the collector of the first transistor of the differential pair 91. Coupled between the collector of transistor 95 and the emitter of a transistor 94 is a resistor R. Similarly, coupled between the collector of transistor 97 and the emitter of a transistor 96 is another resistor R. A reference voltage $V_{ref}$ is applied to the bases of transistors 94 and 96. The collector of transistor 95 is coupled to drive the base of the first transistor of the differential pair 91 and the collector of transistor 97 is coupled to drive the base of the second transistor of the differential pair. Transistors 94, 95 and 96 and the second transistor of the differential pair 91 are configured to have a transistor size x and transistor 97 is configured to have a transistor size 2x.

As shown in FIG. 1, a difference voltage $V_d$ will exist between the collectors of transistors 95 and 97. It is apparent that the bases of transistors 95, 97 and 98 are driven by the collector of the first transistor of the differential pair 91 and the difference voltage $V_d$ is a feedback signal that drives the bases of the differential pair 91. A capacitor C is preferably coupled to the bases of transistors 94, 95 and 96 to enhance stability of this feedback loop. The collector of transistor 98 provides a current $I_{33}$ at a current-source port 99 wherein $I_{33}$ is the current of the current source 33.

In operation of the current source 90, the differently-sized transistors 95 and 97 generate currents I and 2I in response to the collector of the first transistor of the differential pair 91. These currents pass through the resistors R and their associated transistors 94 and 96. Transistor 96 thus operates with twice the current density of transistor 94 so that their base-emitter voltages sum with the voltage drops across the resistors R to generate a difference voltage of $$V_d = \left(V_T \ln\frac{2I}{I_S} + 2IR\right) - \left(V_T \ln\frac{I}{I_S} + IR\right) = V_T \ln 2 + IR. \tag{6}$$

If the current I through the transistor 95 and its associated resistor R are also in accordance with equation (5), then $$V_d = V_T \ln 2 + \frac{V_T}{2} = V_T\left(\frac{1}{2} + \ln 2\right) \approx 1.193 V_T. \tag{7}$$

For the feedback loop in the current source 90 to be consistent, the first and second transistors of the differential pair 91 must generate equal collector currents (which is required by the current mirror 93) when their base-emitter voltages $V_{be}$ differ by the difference voltage $V_d$ of equation (7) (which is required by the unequal current densities of transistors 94 and 96). Noting that a transistor's base-emitter voltage is $$V_{be} = V_T \ln\frac{I_C}{I_S} \tag{8}$$

and noting that the transfer characteristic constant $I_s$ is proportional to the cross-sectional area A of a transistor's emitter, it then follows that $$V_T \ln\frac{A_1}{A_2} = 1.193 V_T \tag{9}$$

which is satisfied when the ratio of emitter areas $A_1/A_2$ of the first and second transistors is approximately 3.297 (the natural logarithm of 1.193). Accordingly, the transistor size of the first transistor in the differential pair 91 is shown as 3.297x.

The current source 90 thus controls its current I in accordance with $$I = \frac{V_T}{2R}. \tag{10}$$

It is noted that transistor 98 has the same base-emitter voltage $V_{be}$ as transistor 95. If it also has the same size and if the drive resistor 37 is the same as the resistor R, then the current through the emitter follower 25 will also satisfy equation (10). It is further noted that the total voltage across the base-emitter voltage $V_{be}$ of emitter follower 25 and its drive resistor 37 equals the total voltage across the base-emitter voltage $V_{be}$ of the first transistor 27 and the inserted resistor 35.

Accordingly, the bias current $I_b$ will be maintained in accordance with equation (5) and the third harmonic of the output voltage $V_{out}$ of equation (3) will be substantially reduced over temperature. Because bulk emitter resistance $r_e$ of the transistor 95 is within the feedback loop of the current source 90, it will automatically be included in the control of this loop and the control of the bias current $I_b$.

The transistor 98, the emitter follower 25 and the first transistor 27 can be scaled up from the size of the transistors 95 and 94 with the drive resistor 37 and the inserted resistor 35 scaled down from the resistor R and the bias current $I_b$ will be maintained in accordance with equation (5). Considered differently, all of the transistors of the current source 90 (except the transistor 98) can be scaled down to reduce current demand. The discussion above was directed to the current source 33 but the current source 34 can be similarly realized with a current source in which the transistors are of opposite polarity.

Figure 4:
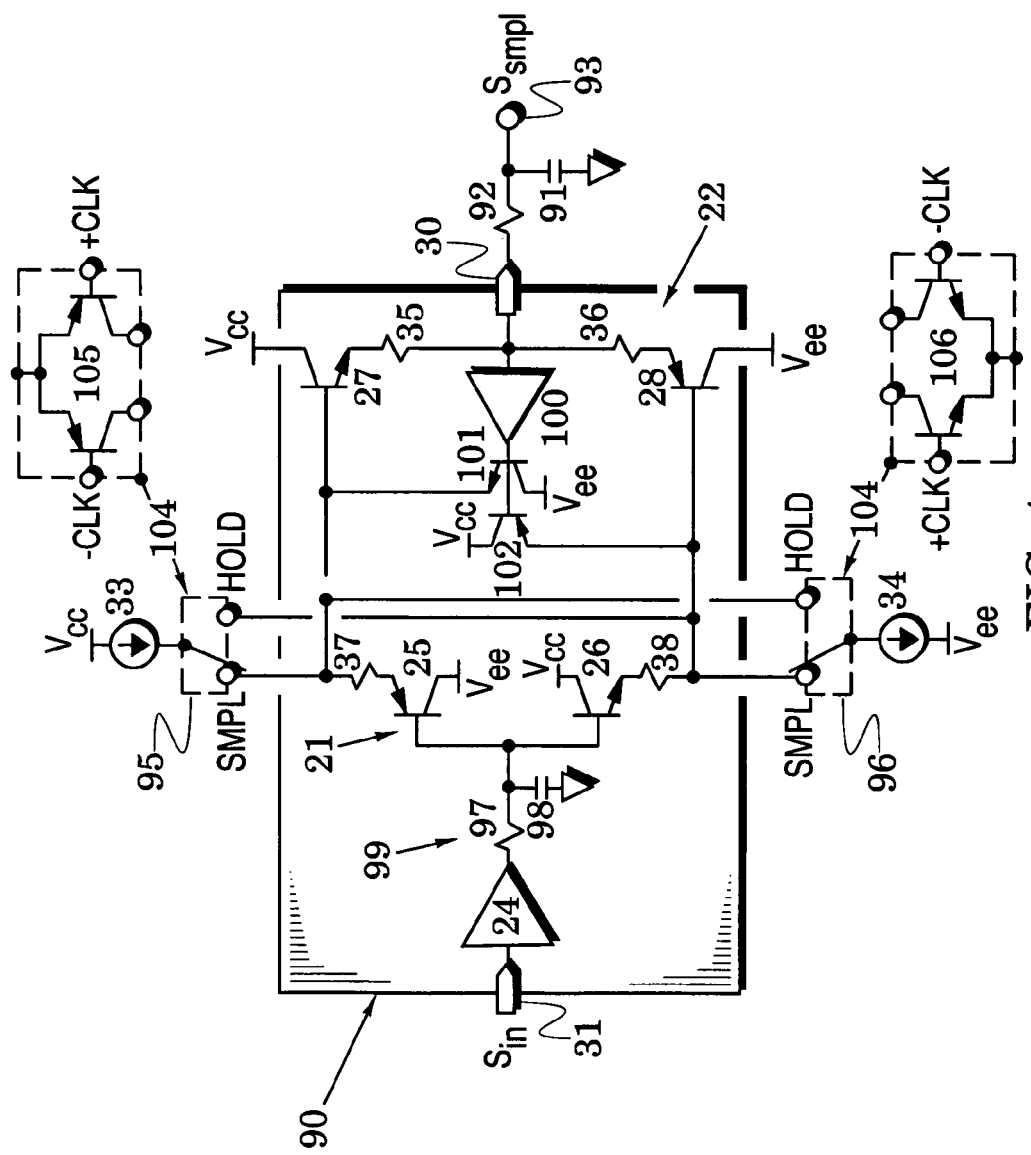
FIG. 4 is a schematic of a sample-and-hold amplifier embodiment that includes elements of FIG. 1; an FIG. 5 is a block diagram of a signal converter that includes the sample-and-hold amplifier of FIG. 4.

FIG. 4 illustrates a sample-and-hold amplifier (SHA) 90 that includes elements of the amplifier 20 of FIG. 1 with like elements indicated by like reference numbers. The load impedance for the SHA 90 is provided by a sample capacitor 91. The load impedance may also include a resistor 92 that represents a series resistance formed by the capacitor and associated circuit paths. In addition, the SHA includes first and second switches 95 and 96 which have been inserted between the current sources 33 and 34 and the remainder of the SHA to provide switched current sources.

When the first and second switches 95 and 96 are in a sample position SMPL, the currents of the current sources 33 and 34 activate the input stage 21 and the complementary common-collector amplifier stage 22 so that sampling currents are exchanged with the sample capacitor 91 in response to an input signal $S_{in}$ at the input port 31. In the sample position, the switch 95, for example, routes current into the base of the first transistor 27 to activate it.

When the first and second switches 95 and 96 are thrown to a hold position HOLD, the currents of the current sources 33 and 34 are redirected so that they deactivate the input stage 21 and the complementary common-collector amplifier stage 22. For example, the current source 34 now pulls current out of the base of the first transistor 27 to deactivate it. Accordingly, a corresponding sample signal $S_{smpl}$ is captured on the sample capacitor 91 and provided at a sample terminal 93.

The switches 95 and 96 will generally introduce switching transients but the buffer amplifier 24 is positioned to substantially isolate the input signal $S_{in}$ from these switching transients. A lowpass filter 99 is formed by a series resistor 97 and a shunt capacitor 98 and positioned between the buffer amplifier 24 and the input stage 21. The SHA 90 preferably has a bandwidth adequate to accurately capture the sample signal $S_{smpl}$ yet sufficiently limited to block noise contributions beyond this bandwidth. The filter 99 is configured to provide this operational bandwidth of the SHA 90.

If the voltage of the base of the first transistor 27 is allowed to drop to a lower level determined by the current source 34, then the difference between the sample signal $S_{smpl}$ and this lower level forms a signal-determined "pedestal" potential during the hold mode of the SHA 90. When the switches 95 and 96 return to their sample positions during the sample mode, a time delay is thus generated during which current must be inserted to reduce this pedestal (similarly, a current must be pulled from the base of the second transistor 28). In the SHA 90, this undesirable time delay is substantially reduced by clamping the bases of the first and second transistors 27 and 28 so that they do not differ from the sample signal $S_{smpl}$ by more than a junction drop.

Accordingly, a transistor 101 has its emitter coupled to the base of the first transistor 27 and has its base driven by a buffer amplifier 100 which is coupled to the output port 30. The base of the first transistor 27 is now clamped so that it cannot fall more than a junction drop below the sample signal $S_{smpl}$. Another transistor 102 has its emitter coupled to the base of the second transistor 28 and has its base driven by the buffer amplifier 100. The base of the second transistor 28 is now clamped so that it cannot rise more than a junction drop above the sample signal $S_{smpl}$. In an embodiment, the gain of the buffer amplifier 100 provides a unity gain.

In one embodiment of the SHA 90, replacement arrows 104 show that the first and second switches 95 and 96 can be realized with differential pairs 105 and 106 of transistors that steer the currents of the current sources 33 and 34 between the SMPL and HOLD terminals in response to clock signals +CLK and −CLK that are alternately applied to their bases.

Figure 5:
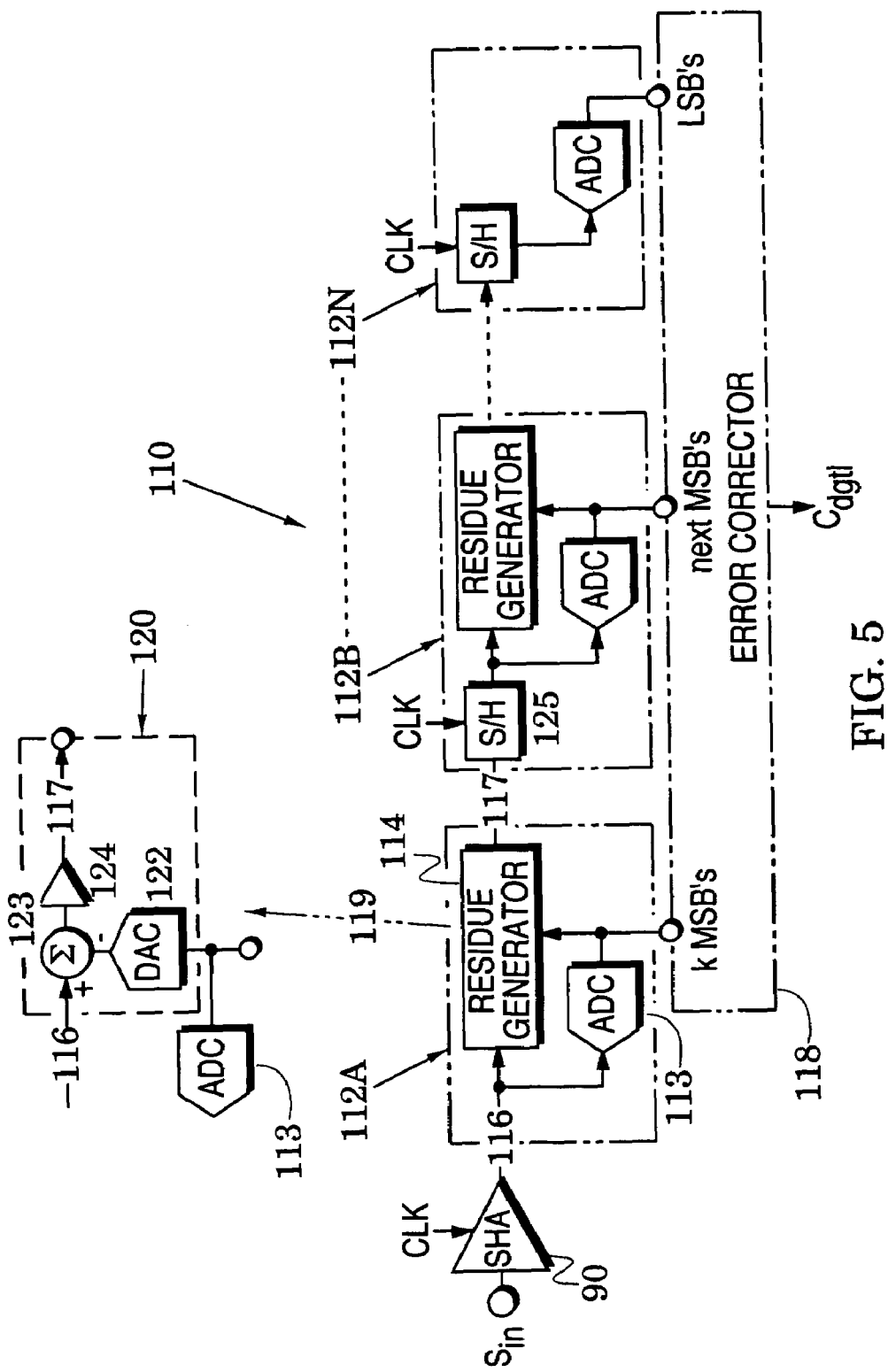

The SHA 90 of FIG. 4 can be advantageously used in signal conditioning systems such as the analog-to-digital converter system 110 of FIG. 5. In addition to the clocked SHA 90 of FIG. 4, this system includes serially-connected converter stages such as the stages 112A, 112B and 112N.

The initial converter stage 112A has an analog-to-digital converter 113 and a residue generator 114. Converter stage 112B has similar structure and final stage 112N has only an analog-to-digital converter. The converter stages are serially connected to thereby convert each of successive samples of an analog input signal $S_{in}$ to a corresponding digital output code $C_{dgtl}$.

In operation, the SHA 90 provides samples 116 of the input signal $S_{in}$ to the initial converter stage 112A. The samples are provided at the rate of an applied clock signal CLK. In the initial converter stage, the converter 113 responds to each sample by generating k of the most significant bits (MSB's) of the corresponding digital code. The residue generator 114 converts the k MSB's to a coarse analog estimate (estimate of the analog sample 116) and subtracts this analog estimate from the sample 116 to form a residue signal 117 which is passed to the subsequent converter stage 112B.

The stage 112B subsequently processes the residue signal 117 in a manner similar to that of the stage 112A to thereby provide further bits of the corresponding digital code and form another residue signal which is passed to succeeding converter stages. This process is continued through the final converter stage 112N except that this stage need not provide a residue signal. Accordingly, this final converter stage only has an analog-to-digital converter that provides the least significant bits (LSBs) of the corresponding digital code.

The successive converter stages are generally designed to provide digital redundancy and an error corrector 118 is typically provided to use this redundancy by accurately processing the bits of the converter stages into successive digital codes $C_{dgtl}$ that each corresponds to a respective one of the analog samples 116.

The embodiment arrow 119 indicates a residue generator embodiment 120 that includes a digital-to-analog converter 122, a summer 123, and an amplifier 124. The converter 122 converts the MSB's from the converter 113 to a coarse analog estimate of the sample 116. This estimate is subtracted from the sample 116 in the summer 123 to form an initial residue.

To enhance conversion accuracy, this initial residue signal is preferably "gained up" in the amplifier 124 so that the analog window presented to the subsequent converter stage is substantially that presented to the preceding converter stage. This gained-up residue signal 117 is then presented to the subsequent converter stage 112B for further conversion processing. This subsequent stage preferably begins with a sample-and-hold (S/H) 125 which captures the gained-up residue signal and holds it during processing in the succeeding converter stage.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of linearizing a complementary common-collector amplifier stage, comprising the steps of:
configuring said stage so that each transistor of said stage drives an output port through a linearizing resistance; and
controlling a bias current through said stage to substantially be the thermal voltage $V_T$ divided by twice said linearizing resistance.

2. The method of claim 1, wherein said configuring step includes the step of, between each of the transistors of said stage and said output port, inserting an inserted resistor having said linearizing resistance.

3. The method of claim 1, wherein said configuring step includes the steps of:
  between each of the transistors of said stage and said output port, inserting an inserted resistor; and
  setting the inserted resistance of said inserted resistor to substantially the difference between said linearizing resistance and the bulk emitter resistance of a respective one of said transistors.

4. The method of claim 1, further including the step of driving each transistor of said stage with a respective emitter follower.

5. The method of claim 4, further including the steps of:
  applying an input signal to the respective emitter follower of each transistor of said stage;
  in a sample mode, directing said bias current to said stage; and
  in a hold mode, directing said bias current away from said stage to thereby capture a sample of said input signal on a capacitor coupled to said port.

6. The method of claim 5, further including the step of limiting a reverse voltage across the base-emitter junction of each transistor of said stage during said hold mode.

7. An amplifier, comprising:
  a complementary common-collector amplifier stage arranged so that each transistor of said stage drives an output port through a linearizing resistance; and
  a current source configured to control a bias current through said stage to substantially be the thermal voltage $V_T$ divided by twice said linearizing resistance.

8. The amplifier of claim 7, further including, between each transistor of said stage and said output port, an inserted resistor wherein each inserted resistor has a resistance substantially equal to said linearizing resistance.

9. The amplifier of claim 7, further including, between each transistor of said stage and said output port, an inserted resistor wherein each transistor of said stage has a bulk emitter resistance and each inserted resistor has a resistance substantially equal to the difference between said linearizing resistance and said bulk emitter resistance.

10. The amplifier of claim 7, further including, for each transistor of said stage,
  a drive resistor coupled to that transistor; and
  an emitter follower arranged to drive said drive resistor.

11. The amplifier of claim 10, wherein said current source includes:
  first and second transistors biased to carry different current densities;
  first and second series resistors respectively providing a series resistance in series with said first and second transistors;
  a feedback loop configured to generate different current densities through said first and second transistors and control a current through said first transistor to substantially be the thermal voltage $V_T$ divided by twice said series resistance; and
  an output transistor that provides said bias current in response to said feedback loop.

12. The amplifier of claim 7, further including a capacitor coupled to said port to receive a sample of an input signal coupled to the respective emitter follower of each transistor of said stage.

13. The amplifier of claim 12, further including first and second switches that direct said bias current through said stage during an operational sample mode and reverse said bias current during a hold mode.

14. The amplifier of claim 13, wherein said first and second switches are first and second differential pairs of transistors.

15. The amplifier of claim 13, further including first and second clamp transistors respectively having first and second emitters respectively coupled to bases of respective transistors of said stage and respectively having first and second bases arranged to be driven by said sample.

16. A signal converter system, comprising:
  a sample-and-hold amplifier (SHA) that provides samples of an input signal;
  serially-connected converter stages that successively convert each of said samples to a corresponding digital code: and
  in said SHA,
  a) a capacitor;
  b) a complementary common-collector amplifier stage arranged so that each transistor of said stage drives said capacitor through a linearizing resistance;
  c) emitter followers coupled to drive said stage in response to said input signal;
  d) a current source configured to provide a bias current that is substantially the thermal voltage $V_T$ divided by twice said linearizing resistance; and
  e) switches that direct said bias current to said stage in an operational sample mode and reverse said bias current in an operational hold mode.

17. The system of claim 16, wherein said first and second switches are first and second differential pairs of transistors.

18. The system of claim 16, wherein said current source includes:
  first and second transistors biased to carry different current densities;
  first and second series resistors respectively providing a series resistance in series with said first and second transistors;
  a feedback loop configured to drive different current densities through said first and second transistors and control a current through said first transistor to substantially be the thermal voltage $V_T$ divided by twice said series resistance; and
  an output transistor that provides said bias current in response to said feedback loop.

19. The system of claim 7, further including, between each transistor of said stage and said capacitor, an inserted resistor wherein each transistor of said stage has a bulk emitter resistance and each inserted resistor has a resistance substantially equal to the difference between said linearizing resistance and said bulk emitter resistance.

20. The system of claim 16, further including first and second clamp transistors respectively having first and second emitters respectively coupled to bases of respective transistors of said stage and respectively having first and second bases arranged to be driven by said sample.

* * * * *